(12) United States Patent
Kim

(10) Patent No.: US 11,996,161 B2
(45) Date of Patent: May 28, 2024

(54) APPARATUSES AND METHODS INCLUDING MULTILEVEL COMMAND AND ADDRESS SIGNALS

(71) Applicant: Micron Technology, Inc., Boise, ID (US)

(72) Inventor: Kang-Yong Kim, Boise, ID (US)

(*) Notice: Subject to any disclaimer, the term of this patent is extended or adjusted under 35 U.S.C. 154(b) by 0 days.

(21) Appl. No.: 17/805,270

(22) Filed: Jun. 3, 2022

(65) Prior Publication Data

US 2022/0301604 A1   Sep. 22, 2022

Related U.S. Application Data

(62) Division of application No. 16/875,798, filed on May 15, 2020, now Pat. No. 11,386,940.

(60) Provisional application No. 62/854,525, filed on May 30, 2019.

(51) Int. Cl.
*G11C 7/10* (2006.01)
*G11C 8/10* (2006.01)
*G11C 8/18* (2006.01)

(52) U.S. Cl.
CPC .......... *G11C 7/1084* (2013.01); *G11C 7/1057* (2013.01); *G11C 7/106* (2013.01); *G11C 7/1087* (2013.01); *G11C 8/10* (2013.01); *G11C 8/18* (2013.01)

(58) Field of Classification Search
CPC ..... G11C 7/1084; G11C 7/1057; G11C 7/106; G11C 7/1087
USPC .................................................... 365/189.05
See application file for complete search history.

(56) References Cited

U.S. PATENT DOCUMENTS

| 5,973,534 | A | 10/1999 | Singh |
| 6,028,449 | A | 2/2000 | Schmitt |
| 6,043,681 | A | 3/2000 | Lim |
| 6,178,133 | B1 | 1/2001 | Manning |
| 6,745,316 | B1 * | 6/2004 | Yang ........................ G11C 11/56 712/1 |

(Continued)

FOREIGN PATENT DOCUMENTS

| CN | 105337616 A | 2/2016 |
| TW | 201602990 A | 1/2016 |

(Continued)

OTHER PUBLICATIONS

U.S. Appl. No. 17/805,264 titled "Apparatuses and Methods Including Multilevel Command and Address Signals" filed Jun. 3, 2022, all pages of application as filed.

(Continued)

*Primary Examiner* — Vu A Le

(57) ABSTRACT

Multilevel command and address (CA) signals are used to provide commands and memory addresses from a controller to a memory system. Using multilevel signals CA signals may allow for using fewer signals compared to binary signals to represent a same number of commands and/or address space, or using a same number of multilevel CA signals to represent a larger number of commands and/or address space. A number of external command/address terminals may be reduced without reducing a set of commands and/or address space. Alternatively, a number of external terminals may be maintained, but provide for an expanded set of commands and/or address space.

18 Claims, 8 Drawing Sheets

(56) References Cited

U.S. PATENT DOCUMENTS

| | | | |
|---|---|---|---|
| 7,656,954 B1* | 2/2010 | Lim | H03K 19/00346 |
| | | | 375/257 |
| 8,013,648 B1 | 9/2011 | Lin et al. | |
| 8,437,343 B1 | 5/2013 | Wagh et al. | |
| 9,531,572 B1* | 12/2016 | Shim | H04L 25/4917 |
| 9,911,469 B1 | 3/2018 | Hollis et al. | |
| 10,015,027 B2 | 7/2018 | Schober | |
| 10,043,557 B1* | 8/2018 | Hollis | G11C 8/10 |
| 11,386,940 B2 | 7/2022 | Kim | |
| 11,830,575 B2 | 11/2023 | Kim | |
| 11,842,791 B2 | 12/2023 | Kim | |
| 2003/0123278 A1 | 7/2003 | Anand et al. | |
| 2004/0027163 A1 | 2/2004 | Carpenter et al. | |
| 2005/0068082 A1 | 3/2005 | Nguyen et al. | |
| 2005/0201491 A1 | 9/2005 | Wei | |
| 2006/0132337 A1 | 6/2006 | Floman et al. | |
| 2006/0190203 A1 | 8/2006 | Cao | |
| 2006/0253816 A1 | 11/2006 | Gould et al. | |
| 2008/0080291 A1 | 4/2008 | Ha | |
| 2008/0143414 A1 | 6/2008 | Takeuchi | |
| 2008/0148091 A1 | 6/2008 | Takeuchi | |
| 2009/0066376 A1 | 3/2009 | Chen et al. | |
| 2009/0267641 A1 | 10/2009 | Chen et al. | |
| 2009/0316485 A1 | 12/2009 | Heo et al. | |
| 2011/0170644 A1 | 7/2011 | Iqbal et al. | |
| 2011/0249520 A1 | 10/2011 | Kim | |
| 2012/0240006 A1* | 9/2012 | Hu | H03M 13/253 |
| | | | 714/752 |
| 2013/0278296 A1 | 10/2013 | Amirkhany et al. | |
| 2013/0307583 A1 | 11/2013 | Hollis et al. | |
| 2014/0003451 A1 | 1/2014 | Wagh et al. | |
| 2015/0348491 A1 | 12/2015 | Kim et al. | |
| 2016/0094202 A1 | 3/2016 | Hollis et al. | |
| 2016/0118110 A1 | 4/2016 | Kim et al. | |
| 2016/0119169 A1 | 4/2016 | Schober | |
| 2016/0211028 A1 | 7/2016 | Berman et al. | |
| 2017/0212695 A1* | 7/2017 | Hollis | H04L 25/4923 |
| 2017/0331476 A1 | 11/2017 | Cho et al. | |
| 2018/0130508 A1 | 5/2018 | Hollis et al. | |
| 2018/0278447 A1 | 9/2018 | Schober | |
| 2019/0066764 A1 | 2/2019 | Spirkl | |
| 2019/0102298 A1* | 4/2019 | Hasbun | G11C 13/0038 |
| 2019/0108864 A1 | 4/2019 | Hollis | |
| 2020/0381025 A1 | 12/2020 | Kim | |
| 2022/0293143 A1 | 9/2022 | Kim | |
| 2022/0293144 A1 | 9/2022 | Kim | |
| 2022/0293145 A1 | 9/2022 | Kim | |
| 2022/0293146 A1 | 9/2022 | Kim | |
| 2022/0293147 A1 | 9/2022 | Kim | |

FOREIGN PATENT DOCUMENTS

| | | | |
|---|---|---|---|
| WO | 2018089064 A1 | 5/2018 | |
| WO | 2020242793 A1 | 12/2020 | |

OTHER PUBLICATIONS

U.S. Appl. No. 17/805,267 titled "Apparatuses and Methods Including Multilevel Command and Address Signals" filed Jun. 3, 2022, all pages of application as filed.

U.S. Appl. No. 17/805,272 titled "Apparatuses and Methods Including Multilevel Command and Address Signals" filed Jun. 3, 2022, all pages of application as filed.

U.S. Appl. No. 17/805,275 titled "Apparatuses and Methods Including Multilevel Command and Address Signals" filed Jun. 3, 2022, all pages of application as filed.

U.S. Appl. No. 17/805,278 titled "Apparatuses and Methods Including Multilevel Command and Address Signals" filed Jun. 3, 2022, all pages of application as filed.

International Search Report & Written Opinion dated Aug. 31, 2020 for PCT Application No. PCT/US2020/033243, pp. all.

IPRP dated Dec. 9, 2021 for PCT Appl. No. PCT/US2020/033243; pp. all.

PCT Patent Application No. PCT/US20/33243, titled "Apparatuses and Methods Including Multilevel Command and Address Signals", dated May 15, 2020, pp. all pages of application as filed.

U.S. Appl. No. 15/348,578 entitled 'Apparatuses and Methods for Power Efficient Driver Circuits' filed on Nov. 10, 2016, pp. all pages of application as filed.

U.S. Appl. No. 15/855,849, entitled "Apparatuses and Methods for Power Efficient Driver Circuits", filed Dec. 27, 2017, pp. all pages of application as filed.

U.S. Appl. No. 15/994,862 titled "Apparatuses and Methods for Adding Offset Delays to Signal Lines of Multi-Level Communication Architectures" filed May 31, 2018, pp. all pages of application as filed.

U.S. Appl. No. 16/439,628 titled "Apparatuses and Methods for Power Efficient Driver Circuits", filed Jun. 12, 2019, pp. all pages of application as filed.

U.S. Appl. No. 16/875,798, titled "Apparatuses and Methods Including Multilevel Command and Address Signals", filed May 15, 2020, pp. all pages of application as filed.

U.S. Appl. No. 62/854,525 titled "Apparatuses and Methods Including Multilevel Command and Address Signals" filed May 30, 2019, pp. all pages of application as filed.

Oh, et al., A 3.2Gb/s/pin 8Gb 1.0V LPDDR4 Sdram with Integrated ECC Engine for Sub-1V DRAM Core Operation, IEEE Journal of Solid-State Circuits, vol. 50, No. 1, Jan. 2015; pp. all.

Brent Keeth et al. "DRAM Circuit Design: A Tutorial"; IEEE Press Series on Microelectronic Systems; 1st publication Nov. 24, 2000; pp. all.

U.S. Appl. No. 18/319,954 titled "Apparatuses and Methods Including Multilevel Command and Address Signals" filed May 18, 2023; pp. all pages of application as filed.

* cited by examiner

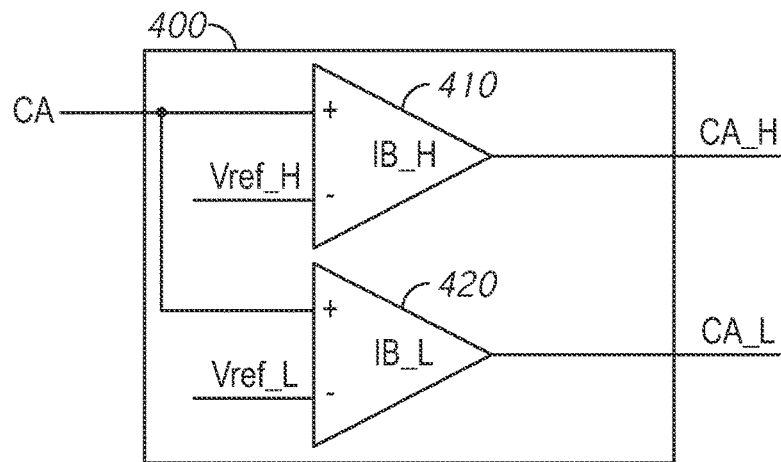
FIG. 4
| Input | CA_H | CA_L | Output Value |
|---|---|---|---|
| Vref_L > CA | 0 | 0 | 0 |
| Vref_L < CA < Vref_H | 0 | 1 | 1 |
| CA > Vref_H | 1 | 1 | 2 |
FIG. 5
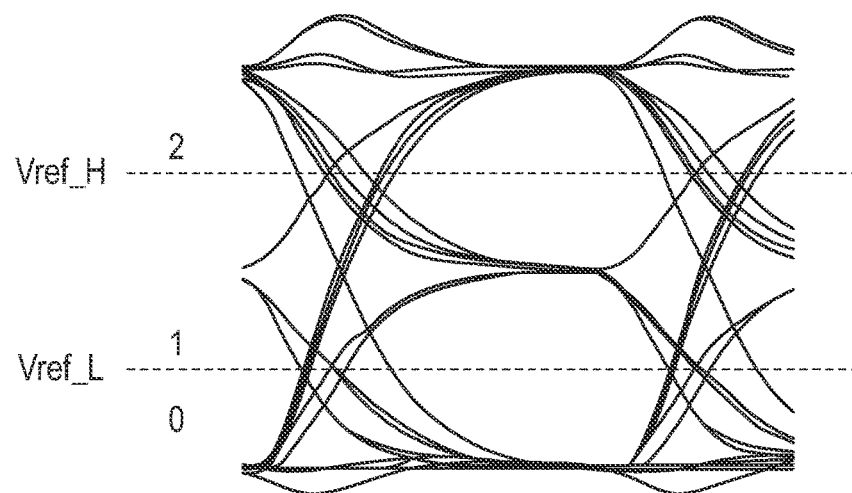
FIG. 6

| CA1 | CA0 | CA1_H | CA1_L | CA0_H | CA0_L | CAO2 | CAO1 | CAO0 |
|---|---|---|---|---|---|---|---|---|
| 0 | 0 | L | L | L | L | L | L | L |
| 0 | 1 | L | L | L | H | L | L | H |
| 0 | 2 | L | L | H | H | L | H | H |
| 1 | 0 | L | H | L | L | L | H | L |
| 1 | 1 | L | H | L | H | - | - | - |
| 1 | 2 | L | H | H | H | H | H | L |
| 2 | 0 | H | H | L | L | H | L | L |
| 2 | 1 | H | H | L | H | H | L | H |
| 2 | 2 | H | H | H | H | H | H | H |

| Command | CS Pin | Command Address Pins | | | | | | | CK Edge |
|---|---|---|---|---|---|---|---|---|---|
| | CS | CA0 | CA1 | CA2 | CA3 | CA4 | CA5 | MPO | |
| ACT-1 | 1 | 1 | 0 | R[18:20] | R[18:20] | R[21:23] | | | R |
| | X | BA[0:2] | | BA[3:4], Flag | | R[15:17] | | | F |
| ACT-2 | 1 | 1 | 1 | R[9:11] | R[9:11] | R[12:14] | | | R |
| | X | R[0:2] | | R[3:5] | | R[6:8] | | | F |
| PRE | 1 | 0 | 0 | 0 | 1 | V | V | | R |
| | X | BA[0:2] | | BA[3:4], AB | | | | | F |
| REF | 1 | 0 | 0 | 1 | 0 | V | V | | R |
| | X | BA[0:2] | | BA[3:4], AB | | | | | F |
| WR16 | 1 | 2 | 0 | 0 | 0 | C[3:5] | C[3:5] | | R |
| | X | BA[0:2] | | BA[3:4], AP | | C[2:0] | C[2:0] | | F |
| WR32 | 1 | 2 | 0 | 1 | 0 | C[3:5] | C[3:5] | | R |
| | X | BA[0:2] | | BA[3:4], AP | | C[2:0] | C[2:0] | | F |
| MWR | 1 | 2 | 0 | 0 | 1 | C[3:5] | C[3:5] | | R |
| | X | BA[0:2] | | BA[3:4], AP | | C[2:0] | C[2:0] | | F |
| RD16 | 1 | 1 | 0 | 0 | 0 | C[3:5] | C[3:5] | | R |
| | X | BA[0:2] | | BA[3:4], AP | | C[2:0] | C[2:0] | | F |
| RD32 | 1 | 1 | 0 | 1 | 0 | C[3:5] | C[3:5] | | R |
| | X | BA[0:2] | | BA[3:4], AP | | C[2:0] | C[2:0] | | F |

*FIG. 12*

APPARATUSES AND METHODS INCLUDING MULTILEVEL COMMAND AND ADDRESS SIGNALS

CROSS-REFERENCE TO RELATED APPLICATION

This application is a divisional of U.S. patent application Ser. No. 16/875,798 filed May 15, 2020 and issued as U.S. Pat. No. 11,386,940 on Jul. 12, 2022, which application claims the filing benefit of U.S. Provisional Application No. 62/854,525, filed May 30, 2019. The aforementioned applications, and issued patent, are incorporated by reference herein in their entirety and for any purpose.

BACKGROUND

Semiconductor memories are used in many electronic systems to store data that may be retrieved at a later time. As demand has increased for electronic systems to be faster, have greater memory capacity, and additional features, semiconductor memories that may be accessed faster, store more data, and include new features have been continually developed to meet the changing needs. Each succeeding generation of semiconductor memories are developed with the aim of improving performance of the memories in the electronic systems.

Semiconductor memories are generally controlled by providing the memories with command and address signals, and clock signals. The various signals may be provided by a memory controller, for example. The command and address signals include memory commands and memory addresses that control the semiconductor memories to perform various memory operations at memory locations corresponding to the memory addresses, for example, a read operation to retrieve data from a memory, and a write operation to store data to the memory. The read data and write data may be provided between the controller and memories with known timing relative to one or more of the clock signals, for example, system clock signals CK and CKF.

As semiconductor memories are developed having greater performance through, for example, increased memory capacity and a greater number of commands and features, the number of memory commands and memory addresses may correspondingly increase. As a result, greater memory control information in the form of command and address signals may likewise increase, often necessitating additional external terminals that receive the command and address signals. However, adding external terminals can increase semiconductor memory die size and increase circuit complexity, both of which may be undesirable. Future semiconductor memory design will benefit from solutions that break through design limitations caused by current approaches to providing memory control information though command and address signals.

BRIEF DESCRIPTION OF THE DRAWINGS

FIG. 4 is a schematic diagram of a multilevel input buffer circuit according to an embodiment of the disclosure.

FIG. 5 is a diagram of a relationship between a three-level input signal and logic levels of output signals representing a value of the three-level input signal according to an embodiment of the disclosure.

FIG. 6 is a diagram of a relationship between a voltage of a three-level input signal and logic values represented by the three-level input signal according to an embodiment of the disclosure.

FIG. 12 is a diagram of a command structure for example commands and addresses for multilevel command and address signals according to an embodiment of the disclosure.

DETAILED DESCRIPTION

Apparatuses and methods are described that use multilevel signals to provide information between a controller and a memory system. In some embodiments of the disclosure, multilevel command and address (CA) signals are used to provide commands and memory addresses from the controller to the memory system. Using multilevel signals, for example, for CA signals, may allow for using fewer signals (compared to binary signals) to represent a same number of commands and/or address space, or using a same number of signals to represent a larger number of commands and/or address space. In the former example, a number of external terminals (e.g., command/address terminals) may be reduced without reducing a set of commands and/or address space. In the latter example, a number of external terminals may be maintained, but providing for an expanded set of commands and/or address space.

Figure 1:
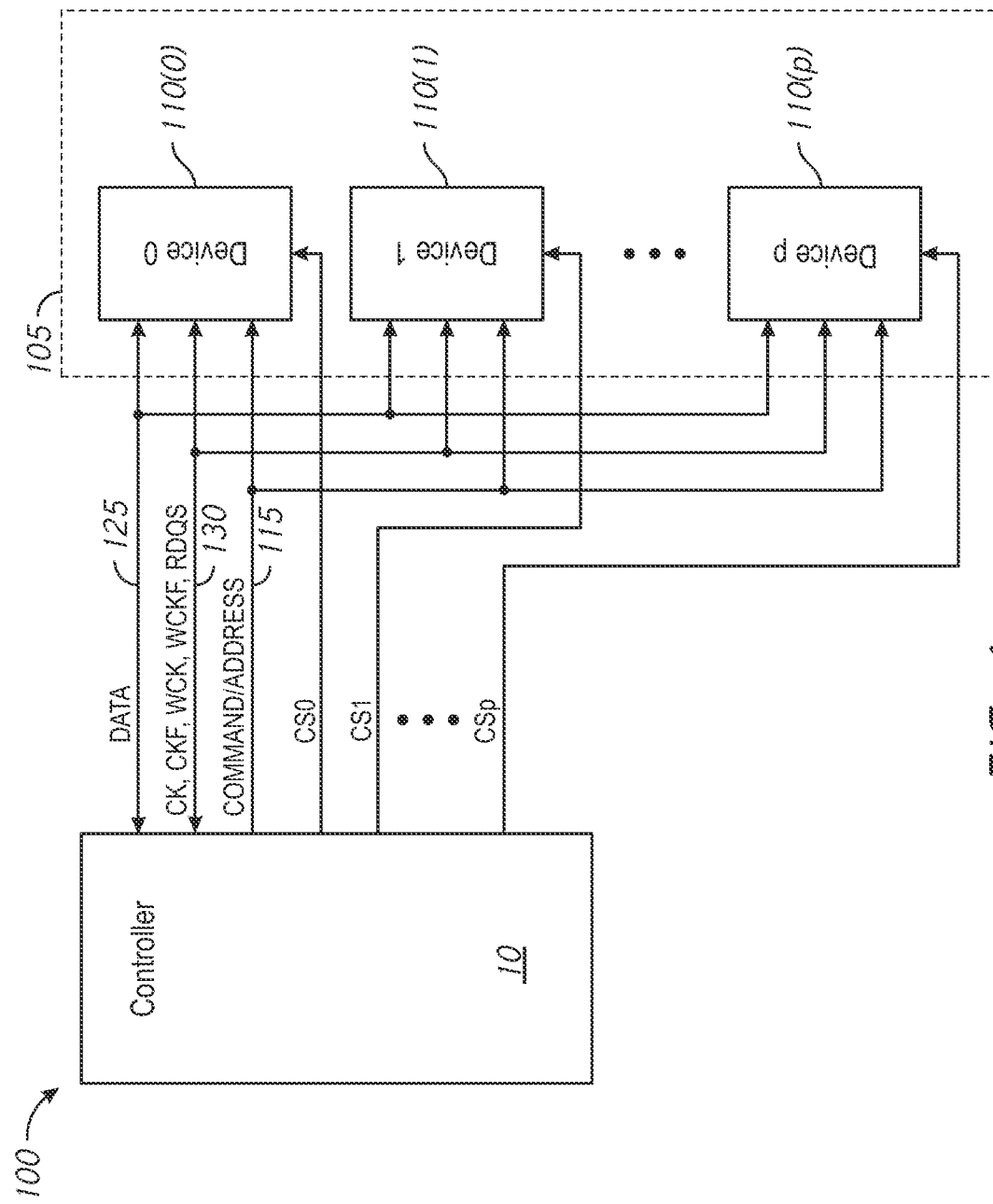
FIG. 1 is a block diagram of a system according to an embodiment of the disclosure.

FIG. 1 is a block diagram of a system 100 according to an embodiment of the disclosure. The system 100 includes a controller 10 and a memory system 105. The memory system 105 includes memories 110(0)-110(p) (e.g., "Device0" through "Devicep"), where p is a non-zero whole number. The memories 110 may be dynamic random access memory (DRAM), such as low power double data rate (LPDDR) DRAM in some embodiments of the disclosure. The memories 110(0)-110(p) are each coupled to the command/address, data, and clock busses. Each of the busses may include one or more signal lines on which signals are provided. The controller 10 and the memory system 105 are in communication over the several busses. For example, commands and addresses (CA) signals are received by the memory system 105 on a command/address bus 115, and data is provided between the controller 10 and the memory system 105 over a data bus 125. Various clock signals may be provided between the controller and memory system 105 over a clock bus 130. The clock bus 130 may include signal lines for providing system clock signals CK and CKF received by the memory system 105, data clock signals WCK and WCKF received by the memory system 105, and an access data clock signal RDQS provided by the memory system 105 to the controller 10.

The CK and CKF signals provided by the controller 10 to the memory system 105 are used for timing the provision and receipt of the commands and addresses. The WCK and WCKF signals and the RDQS signal are used for timing the provision of data. The CK and CKF signals are complementary and the WCK and WCKF signals are complementary. The WCK and WCKF signals provided by the controller 10 to the memory system 105 may be synchronized to the CK and CKF signals also provided by the controller 10 to the memory system 105.

The controller 10 provides commands to the memory system 105 to perform memory operations. Non-limiting examples of memory commands include timing commands for controlling the timing of various operations, access commands for accessing the memory, such as read commands for performing read operations and write commands for performing write operations. The command signals provided by the controller 10 to the memory system 105 further include select signals (e.g., chip select CS signals CS0, CS1, CSp). While all of the memories 110 are provided the commands, addresses, data, and clock signals, the select signals provided on respective select signal lines are used to select which of the memories 110 will respond to the command and perform the corresponding operation. In some embodiments of the disclosure, a respective select signal is provided to each memory 110 of the memory system 105. The controller 10 provides an active select signal to select the corresponding memory 110. While the respective select signal is active, the corresponding memory 100 is selected to receive the commands and addresses provided on the command/address bus 115.

The CA signals provided by the controller 10 to the memory system 105 may be multilevel signals that represent commands and addresses. The multilevel CA signals have respective voltage levels that correspond to one of multiple different voltage ranges. Each of the different voltage ranges corresponds to a respective value. The combination of values represented by the multilevel CA signals are used by the memory system 105 to identify commands issued by the controller 10 and memory addresses to which the commands are directed. In some embodiments of the disclosure, the CA signals may have respective voltage levels that corresponds to one of three different ranges of voltages (e.g., three-level signaling). In other embodiments of the disclosure, the CA signals may have a respective voltage level that corresponds to one of four different ranges of voltages (e.g., four-level signaling). The disclosure is not intended to be limited to three- or four-level signaling, and more generally, not intended to be limited to any particular number-level signaling.

In operation, when an activation command and read command, and associated address are provided by the controller 10 to the memory system 105, the memory 110 selected by the select signals receives the commands and associated address, and performs a read operation to provide the controller 10 with read data from a memory location corresponding to the associated address. In preparation of the selected memory 110 providing the read data to the controller 10, the controller provides active WCK and WCKF signals to the memory system 105. The WCK and WCKF signals may be used by the selected memory 110 to generate an access data clock signal RDQS. The RDQS signal is provided by the memory 110 performing the read operation to the controller 10 for timing the provision of read data to the controller 10. The controller 10 may use the RDQS signal for receiving the read data.

When an activation command and write command, and associated address are provided by the controller 10 to the memory system 105, the memory 110 selected by the select signals receives the commands and associated address, and performs a write operation to write data from the controller 10 to a memory location corresponding to the associated address. In preparation of the selected memory 110 receiving the write data from the controller 10, the controller provides active WCK and WCKF signals to the memory system 105. The WCK and WCKF signals may be used by the selected memory 110 to generate internal clock signals for timing the operation of circuits to receive the write data. The data is provided by the controller 10 and the selected memory 110 receives the write data according to the WCK and WCKF signals, which is written to memory corresponding to the memory addresses.

Figure 2:
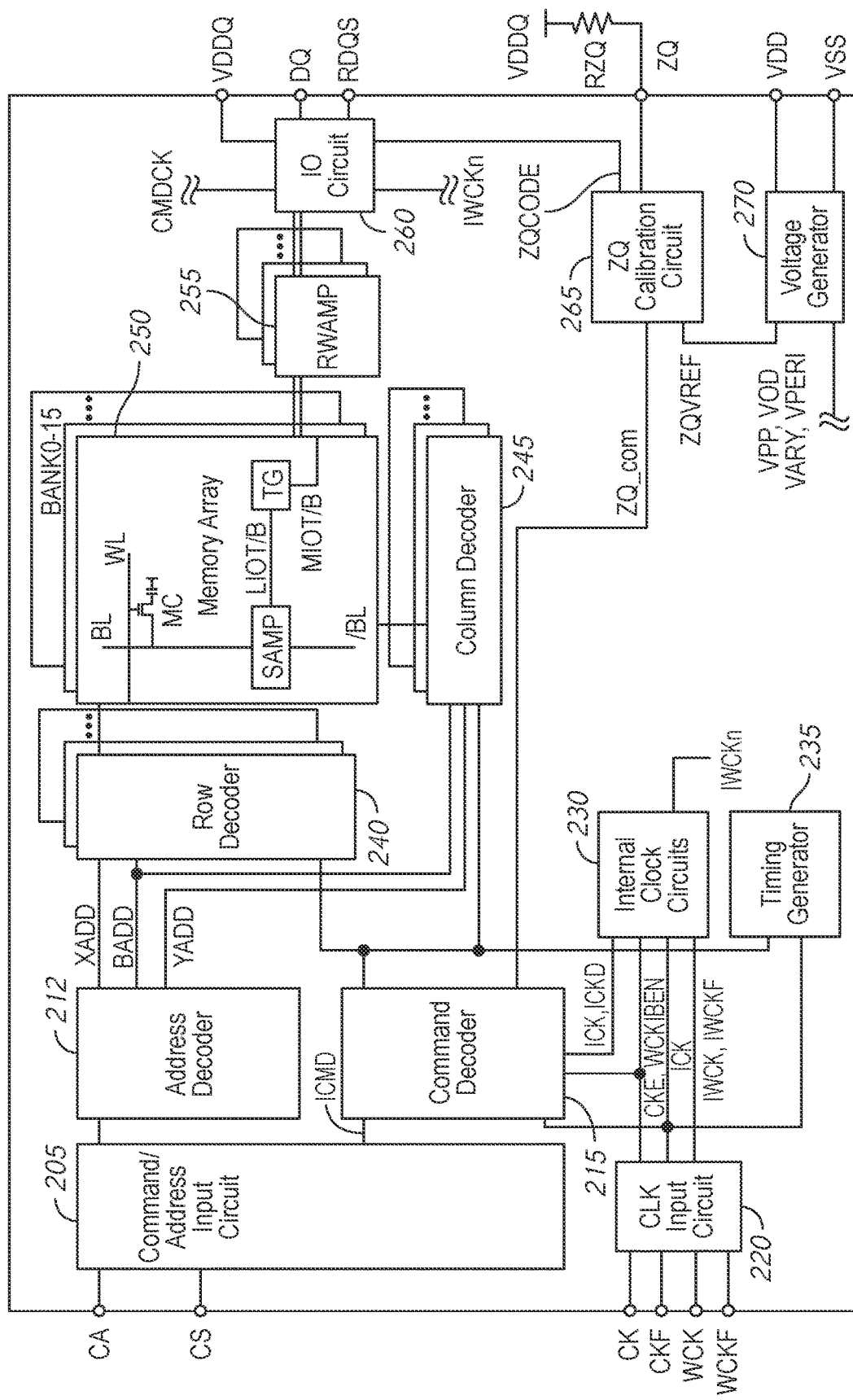
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred as such. In some embodiments, the semiconductor device 200 may include, without limitation, a memory, such as a LPDDR memory integrated into a single semiconductor die, for example. In some embodiments of the disclosure, the semiconductor die may include only semiconductor device 200. In some embodiments of the disclosure, the semiconductor die may include the semiconductor device 200 embedded with other systems integrated on the same semiconductor die. The semiconductor device 200 may be included in the memory system 105 of FIG. 1 in some embodiments of the disclosure. For example, each of the memories 110 may include a semiconductor device 200.

The semiconductor device 200 may include a memory array 250. The memory array 250 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 200 may employ a plurality of external terminals (e.g., pins) that include command/address terminals coupled to a command/address bus to receive command and address signals CA. The CA signals may be multilevel signals representing commands and addresses. For example, the CA signals may represent commands and addresses having a command structure that includes a command operand and memory addresses.

A command/address input circuit 205 receives the CA signals at the command/address terminals and provides address signals and provides command signals ICMD to the address decoder 212 and the command decoder 215, respectively. The address signals and command signals are based on the combination of values of the multilevel CA signals received by the command/address input circuit 205. The address decoder 212 receives the address signals and provides decoded row address signals XADD to the row decoder 240, and decoded column address signals YADD to the column decoder 245. The address decoder 212 also provides bank address signals BADD to the row decoder 240 and the column decoder 245. The command decoder 215 includes circuits to decode the command signals ICMD to generate various internal signals and commands for performing operations. For example, the command decoder 215 provides internal signals to control the circuits of the semiconductor device 200 to access the memory array 250 based on the command signals, such as to read data from or write data to the memory array 250 based on a read command or a write command, respectively.

The semiconductor device 200 may further employ a select terminal to receive a select signal CS, clock terminals to receive clock signals CK and CKF, data clock terminals to receive data clock signals WCK and WCKF, data terminals DQ and RDQS, power supply terminals VDD, VSS, and VDDQ, and the ZQ calibration terminal (ZQ).

The select terminal may be provided a select signal CS used to select the semiconductor device 200 to receive the CA signals. For example, when the CS signal is active (e.g., active high logic level) the semiconductor device 200 is activated to receive the CA signals on a command/address bus, for example, command/address bus 115 of FIG. 1.

When an activation command is received and bank and row addresses are timely provided with the activation command, and a read command is received and bank and column addresses are timely provided with the read command, read data is read from memory in the memory array 250 designated by the addresses. The command/address input circuit 205 provides the activation and read commands to the command decoder 215 and provides the addresses to the address decoder 212. The command decoder 215 provides internal commands to input/output circuit 260 and the address decoder 212 provides decoded addresses to the row and column decoders so that read data from the memory designated by the addresses is output to outside from the data terminals DQ via read/write amplifiers 255 and the input/output circuit 260 according to the RDQS clock signals.

When an activation command is received and bank and row addresses are timely provided with the activation command, and a write command is received and bank and column addresses are timely provided with the write command, write data provided to the data terminals DQ is written to memory in the memory array 250 designated by the addresses. The command/address input circuit 205 provides the activation and write commands to the command decoder 215 and provides the addresses to the address decoder 212. The command decoder 215 provides internal commands to the input/output circuit 260 and the address decoder 212 provides decoded addresses to the row and column decoders so that the write data is received by data receivers in the input/output circuit 260, and provided via the input/output circuit 260 and the read/write amplifiers 255 to the memory of the memory array 250 designated by the addresses.

The clock terminals and data clock terminals are provided with external clock signals. The external clock signals CK, CKF, WCK, WCKF may be provided to a clock input circuit 220. The CK and CKF signals may be complementary and the WCK and WCKF signals may be complementary. When enabled, input buffers included in the clock input circuit 220 receive the external clock signals. For example, an input buffer receives the CK and CKF signals when enabled by a CKE signal from the command decoder 215 and an input buffer receives the WCK and WCKF signals when enabled by a WCKIBEN signal from the command decoder 215. The clock input circuit 220 may receive the external clock signals to generate internal clock signals ICK and IWCK and IWCKF. The internal clock signals ICK and IWCK and IWCKF are provided to internal clock circuits 230. The internal clock circuits 230 includes circuits that provide various phase and frequency controlled internal clock signals IWCKn based on the received internal clock signals. The multiphase clock signals IWCKn may be provided to the input/output circuit 260 for controlling an output timing of read data and the input timing of write data.

The power supply terminals are provided with power supply potentials VDD and VSS. These power supply potentials VDD and VSS are provided to an internal voltage generator circuit 270. The internal voltage generator circuit 270 generates various internal potentials VPP, VOD, VARY, VPERI, and the like and a reference potential ZQVREF based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks. The reference potential ZQVREF is used in the ZQ calibration circuit 265.

The power supply terminal is also provided with power supply potential VDDQ. The power supply potentials VDDQ is provided to the input/output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

The calibration terminal ZQ is connected to the ZQ calibration circuit 265. The ZQ calibration circuit 265 performs a calibration operation with reference to an impedance of RZQ, and the reference potential ZQVREF, when activated by the ZQ calibration command ZQ_com. An impedance code ZQCODE obtained by the calibration operation is provided to the input/output circuit 260, and thus an impedance of an output buffer (not shown) included in the input/output circuit 260 is specified.

Figure 3:
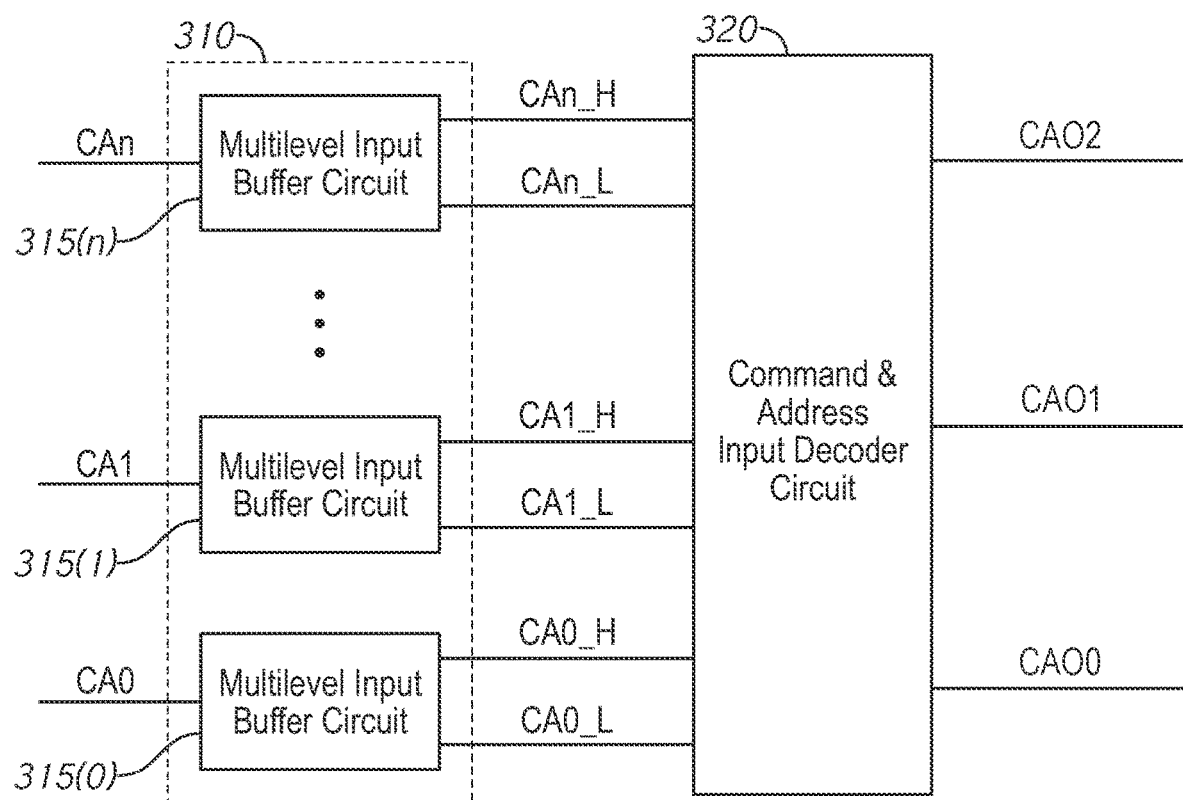
FIG. 3 is a block diagram of a multilevel input buffer and command and address input decoder circuit according to an embodiment of the disclosure.

FIG. 3 is a block diagram of a multilevel input buffer 310 and command and address input decoder circuit 320 according to an embodiment of the disclosure. In some embodiments of the disclosure, the multilevel input buffer 310 and command and address input decoder circuit 320 may be included in the command/address input circuit 205 of the semiconductor device 200 of FIG. 2.

The multilevel input buffer 310 includes multilevel input buffer circuits 315(0)-315(n), where n is a non-zero whole number. Each of the input buffer circuits 315 receives a respective command/address (CA) signal CA0-CAn. For example, the input buffer circuit 315(0) receives the command/address signal CA0, the input buffer circuit 315(1) receives the command/address signal CA1, and so on. Each of the CA signals may be provided on a respective command/address terminal. For example, in some embodiments of the disclosure, the respective terminal is a respective one of the command/address terminals of the semiconductor device 200 of FIG. 2.

In some embodiments of the disclosure, the CA signals are multilevel input signals. For example, the command/address signals have respective voltage levels that corresponds to one of multiple different voltage ranges as detected by the input buffer circuit 315. The CA signals may have a respective voltage level that corresponds to one of three different voltage ranges (e.g., three-level signaling) in some embodiments of the disclosure. In other embodiments of the disclosure, the command/address signals may have a respective voltage level that corresponds to one of four different voltage ranges (e.g., four-level signaling) in some embodiments of the disclosure. The disclosure is not intended to be limited to three- or four-level signaling, and more generally, not intended to be limited to any particular number-level signaling.

The input buffer circuits 315 provide an output signal CAn_H and an output signal CAn_L that have logic levels based on the respective CAn signal. For example, the input buffer circuit 315(0) provides the CA0_H signal and the CA0_L signal having logic levels based on a voltage level of the CA0 signal, the input buffer circuit 315(1) provides the CA1_H signal and the CA1_L signal having logic levels based on a voltage level of the CA1 signal, and so on.

In some embodiments of the disclosure, pairs of the CAn_H and CAn_L signals may have respective logic levels that represent values based on the respective CA signals. For example, a low logic level CAn_H signal and a low logic level CAn_L (i.e., "00") may represent a value of 0; a low logic level CAn_H signal and a high logic level CAn_L (i.e., "01") may represent a value of 1; and a high logic level CAn_H signal and a high logic level CAn_L (i.e., "11") may represent a value of 2. The value represented by the CAn_H and CAn_L signals may correspond to a value of the respective CA signal.

Figures 7, 8:
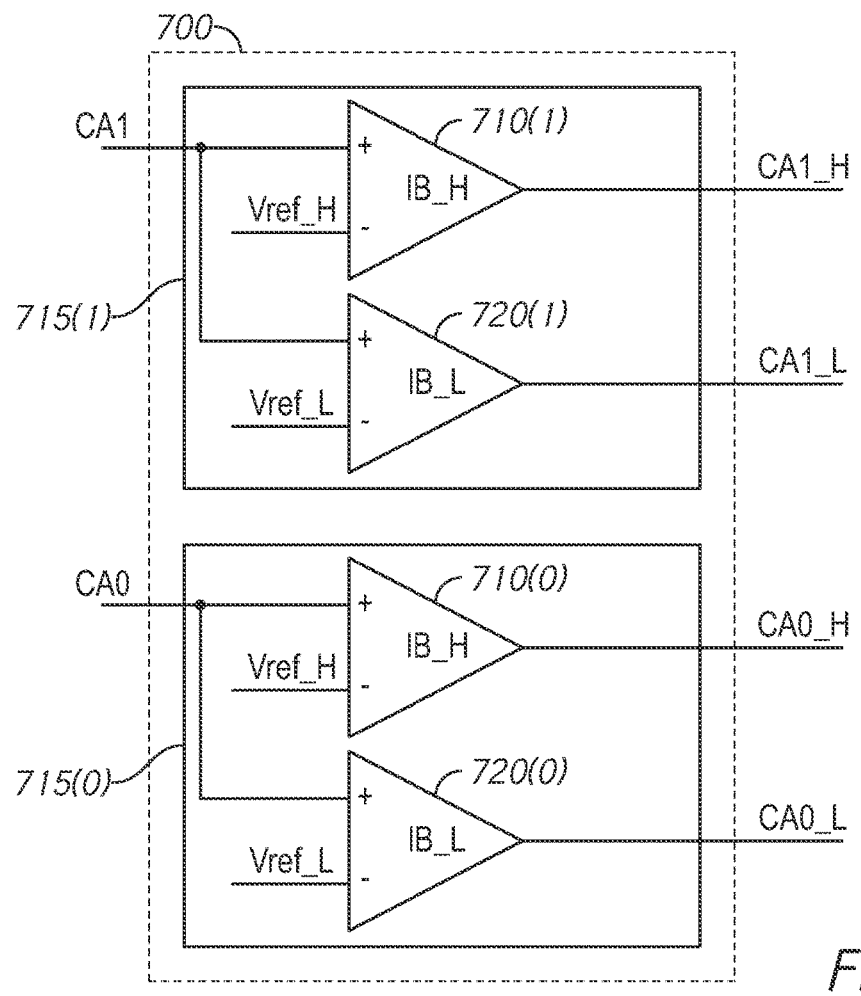
FIG. 7 is a schematic diagram a multilevel input buffer including a pair of multilevel input buffer circuits according to an embodiment of the disclosure.
FIG. 8 is a diagram of a relationship between two three-level input signals, output signals, and decoded signals according to an embodiment of the disclosure.

The output signals CAn_H and CAn_L may be provided to the command and address input decoder circuit 320. The input decoder circuit 320 provides decoded signals CAO0-CAO2 having respective logic levels based on the logic levels of the CAn_H and CAn_L signals. For example, the input decoder circuit 320 may provide decoded signals CAO0-CAO2 having respective logic levels based on the logic levels of the CA0_H and CA0_L, and CA1_H and CA1_L signals provided by the input buffer circuits 315(0) and 315(1), respectively. In some embodiments of the disclosure, the input decoder circuit 320 may provide the decoded signals CAO0-CAO2 based on the respective logic levels of the CA0_H and CA0_L, and CA1_H and CA1_L signals as shown by FIG. 8, which will be described below. The CAO0-CAO2 may represent three bits of information, each decoded signal corresponding to one bit.

The decoded signals CAO0-CAO2 may be provided to an address decoder and/or command decoder accordingly (e.g., address decoder 212 and/or command decoder 215 of FIG. 2). As previously described, the address decoder and/or command decoder receives the signals and provides internal address and control signals to perform operations corresponding to the CA signals.

As previously described, in some embodiments of the disclosure the input buffer circuits 315 receive multilevel CA signals. Multilevel signals may be used to represent greater amounts of information than, for example, binary (i.e., two-level) signals that have two different voltage levels to represent one bit of information. In contrast, in an example including two input buffer circuits 315 (e.g., input buffer circuits 315(0) and 315(1)), each receiving a respective three-level CA signal, the two multilevel signals can represent three bits of data (compared to representing two bits of data for binary signals). Scaling from two input buffer circuits 315 to, for example, six input buffer circuits 315, each receiving a respective three-level CA signal, the six signals may represent nine bits of data, compared to six bits of data for six binary signals.

Using multilevel signals, for example, for CA signals, may allow for using fewer signals (compared to binary signals) to represent a same number of commands and/or address space, or using a same number of signals to represent a larger number of commands and/or address space. In the former example, a number of external terminals (e.g., command/address terminals) may be reduced without reducing a set of commands and/or address space. In the latter example, a number of external terminals may be maintained, but providing for an expanded set of commands and/or address space.

FIG. 4 is a schematic diagram of a multilevel input buffer circuit 400 according to an embodiment of the disclosure. The multilevel input buffer circuit 400 may be included in the multilevel input buffer circuit 315 of FIG. 3 in some embodiments of the disclosure.

The multilevel input buffer 400 includes buffer circuits 410 and 420. The buffer circuit 410 is provided a (high) reference voltage Vref_H and the buffer circuit 420 is provided a (low) reference voltage Vref_L. The Vref_H voltage is greater than the Vref_L voltage. The buffer circuits 410 and 420 are also provided a command/address signal CA. The buffer circuit 410 provides an output signal CA_H based on the CA signal and the Vref_H voltage, and the buffer circuit 420 provides an output signal CA_L based on the CA signal and the Vref_L voltage. For example, the buffer circuit 410 provides the CA_H signal having a logic level based on a voltage of the CA signal relative to the Vref_H voltage, and the buffer circuit 420 provides the CA_L signal having a logic level based on a voltage of the CA signal relative to the Vref_L voltage.

In an example operation, the buffer circuit 410 provides a high logic level CA_H signal when a voltage of the CA signal is greater than the Vref_H voltage and provides a low logic level CA_H signal when the voltage of the CA signal is less than the Vref_H voltage, and the buffer circuit 420 provides a high logic level CA_L signal when a voltage of the CA signal is greater than the Vref_L voltage and provides a low logic level CA_L signal when the voltage of the CA signal is less than the Vref_L voltage.

The resulting CA_H and CA_L signals may be decoded with other CA_H and CA_L signals by a command and address input decoder circuit (e.g., command and address input decoder circuit 320 of FIG. 3) to provide decoded output signals.

FIG. 5 is a diagram of a relationship between a three-level input signal and logic levels of output signals representing a value of the three-level input signal according to an embodiment of the disclosure. The relationship of FIG. 5 may be provided by the multilevel input buffer circuit 400 of FIG. 4 in some embodiments of the disclosure. In such embodiments of the disclosure, the three-level input signal may be represented by the command/address signal CA.

The relationship of the three-level input signal and logic values of FIG. 5 will be described with reference to the multilevel input buffer circuit 400.

When the CA signal has a voltage that is less than a (low) reference voltage Vref_L (and also necessarily less than a (high) reference voltage Vref_H), the buffer circuit 420 provides a low logic level CA_L signal (i.e., "0") and the buffer circuit 410 also provides a low logic level CA_H signal (i.e., "0"). The "00" for the CA_H and CA_L signals corresponds to a value of 0. Thus, a multilevel CA signal that is less than Vref_L and Vref_H corresponds to a value of 0 and may be represented by "00" for the CA_H and CA_L signals.

When the CA signal has a voltage that is less than the Vref_H voltage but greater than the Vref_L voltage, the buffer circuit 420 provides a low logic level CA_L signal (i.e., "0") and the buffer circuit 410 provides a high logic level CA_H signal (i.e., "1"). The "10" for the CA_H and CA_L signals corresponds to a value of 1. Thus, a multilevel CA signal that is less than Vref_H and greater than Vref_L corresponds to a value of 1 and may be represented by "10" for the CA_H and CA_L signals.

When the CA signal has a voltage that is greater than the Vref_H voltage (and also necessarily greater than the Vref_L voltage), the buffer circuit 420 provides a high logic level CA_L signal (i.e., "1") and the buffer circuit 410 also provides a high logic level CA_H signal (i.e., "1"). The "11" for the CA_H and CA_L signals corresponds to a value of 2. Thus, a multilevel CA signal that is greater than Vref_L and Vref_H corresponds to a value of 2 and may be represented by "11" for the CA_H and CA_L signals.

As shown by the previous example, the three-level CA signal may represent three different values (e.g., values 0, 1, and 2). Each of the values may be represented by the logic levels of the pair of output signals CA_H and CA_L.

FIG. 6 is a diagram of a relationship between a voltage of a three-level input signal and logic values represented by the three-level input signal according to an embodiment of the disclosure. The relationship of FIG. 6 may represent the relationship between a three-level signal and logic values of FIG. 5 in some embodiments of the disclosure. The relationship of FIG. 6 may be provided by the multilevel input buffer circuit 400 of FIG. 4 in some embodiments of the disclosure. In such embodiments of the disclosure, the voltage shown in FIG. 6 may represent a voltage of a command/address signal CA.

The relationship of the voltage of a three-level input signal and logic values of FIG. 6 will be described with reference to the relationship between a three-level signal and logic values of FIG. 5.

A voltage of the three-level input signal that is less than a (low) reference voltage Vref_L (and also necessarily less than a (high) reference voltage Vref_H) corresponds to a logic value of 0.

A voltage of the three-level input signal that is less than the Vref_H voltage but greater than the Vref_L voltage corresponds to a logic value of 1.

A voltage of the three-level input signal that is greater than the Vref_H voltage (and also necessarily greater than the Vref_L voltage) corresponds to a logic value of 2.

FIG. 7 is a schematic diagram a multilevel input buffer 700 including a pair of multilevel input buffer circuits 715(0) and 715(1) according to an embodiment of the disclosure. In some embodiments of the disclosure, the pair of multilevel input buffer circuits 715(0) and 715(1) may be included in the command/address input circuit 205 of the semiconductor device 200 of FIG. 2. The pair of multilevel input buffer circuits 715(0) and 715(1) may be included in the multilevel input buffer 310 of FIG. 3 in some embodiments of the disclosure.

The multilevel input buffer circuit 715(0) includes buffer circuits 710(0) and 720(0). The buffer circuit 710(0) is provided a (high) reference voltage Vref_H and the buffer circuit 720(0) is provided a (low) reference voltage Vref_L. The Vref_H voltage is greater than the Vref_L voltage. The buffer circuits 710(0) and 720(0) are also provided a command/address signal CA0. The multilevel input buffer circuit 715(1) includes buffer circuits 710(1) and 720(1). The buffer circuit 710(1) is provided the Vref_H voltage and the buffer circuit 720(1) is provided the Vref_L voltage. The buffer circuits 710(1) and 720(1) are also provided a command/address signal CA1. The CA0 and CA1 signals may be multilevel input signals (e.g., three-level signals).

The buffer circuit 710(0) provides an output signal CA0_H based on the CA0 signal and the Vref_H voltage, and the buffer circuit 720(0) provides an output signal CA0_L based on the CA0 signal and the Vref_L voltage. For example, the buffer circuit 710(0) provides the CA_H signal having a logic level based on a voltage of the CA0 signal relative to the Vref_H voltage, and the buffer circuit 720(0) provides the CA_L signal having a logic level based on a voltage of the CA0 signal relative to the Vref_L voltage.

The buffer circuit 710(1) provides an output signal CA1_H based on the CA1 signal and the Vref_H voltage, and the buffer circuit 720(1) provides an output signal CA1_L based on the CA1 signal and the Vref_L voltage. The buffer circuits 710(1) and 720(1) may operate in a manner similar to the buffer circuits 710(0) and 720(0) as previously described.

As previously described with reference to FIG. 3, in an example including two input buffer circuits, each receiving a respective three-level command/address signal, two signals can represent three bits of data. In such embodiments of the disclosure, a pair of input buffer circuits may be included for each pair of CA signals.

An example operation of two input buffer circuits, each receiving a respective three-level command/address signal, will be described with reference to the pair of multilevel input buffer circuits 715(0) and 715(1). In the example operation, the CA0_H and CA0_L signals from the input buffer circuit 715(0), and the CA1_H and CA1_L signals from the input buffer circuit 715(1) are provided to a command and address input decoder circuit, for example, command and address input decoder circuit 320 of FIG. 3. The command and address input decoder circuit, as previously described, provides decoded signals CAO0, CAO1, and CAO2 representing three bits of data.

In some embodiments of the disclosure, two three-level command/address (CA) signals may be decoded by a pair of multilevel input buffer circuits (e.g., multilevel input buffer circuits 715(0) and 715(1)), and a command and address input decoder circuit (e.g., command and address input decoder circuit 320) to provide three bits of information CAO0-CAO2 as follows:

Example of CA Decoding:
When CA1=0→CAO2=L, CAO1=CA0_H, CAO0=CA0_L
When CA1=2→CAO2=H, CAO1=CA0_H, CAO0=CA0_L
When CA1=1→CAO2=CA0_H, CAO1=H, CAO0=L FIG. 8 is a diagram of a relationship between two three-level input signals CA1 and CA0, output signals CA1_H and CA1_L, and CA0_H and CA0L, and decoded signals CAO2-CAO0 according to an embodiment of the disclosure. The decoded signals CAO2-CAO0 may represent three bits of data. The relationship of FIG. 8 may be provided by the Example of CA Decoding previously described.

In some embodiments of the disclosure, the relationship of FIG. 8 may be provided by the pair multilevel input buffer circuits 715(0) and 715(1) of FIG. 7 and the command and address input decoder circuit 320 of FIG. 3.

The relationship of FIG. 8 will be described with reference to the multilevel input buffer circuits 715(0) and 715(1) and the command and address input decoder circuit 320.

FIG. 8 shows the CA1 and CA0 signals, which may have one of three different values (e.g., 0, 1, or 2), and the output signals CA1_H and CA1_L, and CA0_H and CA0_L provided by the input buffer circuits 715(1) and 715(0), respectively. The output signals may have a low logic level "L" (e.g., a "0" bit) or a high logic level "H" (e.g., a "1" bit).

In an example, as shown in the relationship of FIG. 8, when the CA1 signal has a voltage corresponding to a 0 value and the CA0 signal has a voltage corresponding to a 1 value, the resulting high and low output signals are CA1_H=L and CA1_L=L, and CA0_H=L and CA0_L=H (e.g., provide by multilevel input buffer circuits 715(1) and 715(0)). In another example, when the CA1 signal has a voltage corresponding to a 2 value and the CA0 signal has a voltage corresponding to a 1 value, the resulting high and low output signals are CA1_H=H and CA1_L=H, and CA0_H=L and CA0_L=H. Other combinations of the CA1 and CA0 signals and corresponding output signals CA1_H and CA1_L, and CA0_H and CA0_L are also shown in FIG. 8.

The output signals CA1_H and CA1_L, and CA0_H and CA0_L may be decoded by the command and address input decoder circuit 320 to provide the decoded signals CAO2, CAO1, and CAO0 as shown by FIG. 8. The decoded signals may have a low logic level "L" (e.g., a "0" bit) or a high logic level "H" (e.g., a "1" bit).

In an example, as shown in the relationship of FIG. 8, when CA1_H=L and CA1_L=L, and CA0_H=L and CA0_L=H, which is one of the previously described examples, the corresponding decoded signals are CAO2=L, CAO1=L, and CAO0=H. In another example, when CA1_H=H and CA1_L=H, and CA0_H=L and CA0_L=H, which is the other previously described example, the corresponding decoded signals are CAO2=H, CAO1=L, and CAO0=H. Other combinations of the high and low output signals CA1_H and CA1_L, and CA0_H and CA0_L and corresponding CAO2, CAO1, and CAO0 signals are also shown in FIG. 8.

Figures 9, 10:
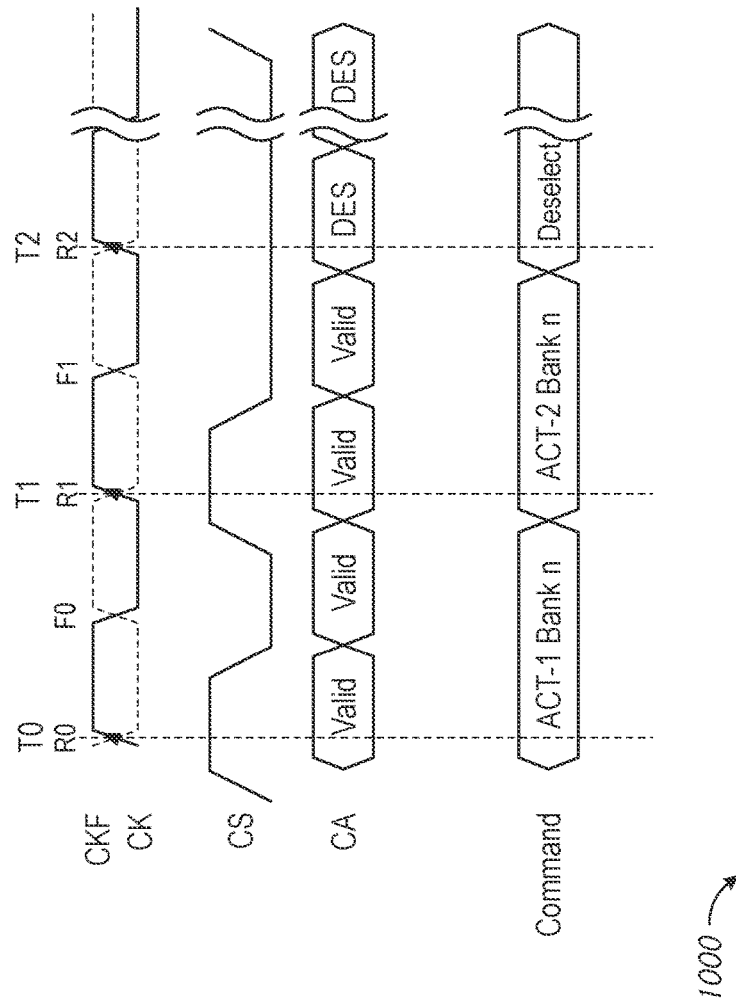
FIG. 9 is a timing diagram showing various signals for receiving commands and/or addresses at a semiconductor device according to an embodiment of the disclosure.
FIG. 10 is a diagram of a command structure for example commands and addresses for multilevel command and address signals according to an embodiment of the disclosure.

FIG. 9 is a timing diagram showing various signals for receiving commands and/or addresses at a semiconductor device according to an embodiment of the disclosure. In some embodiments of the disclosure, the semiconductor device 200 of FIG. 2 may receive commands and/or addresses as shown in the timing diagram of FIG. 9. The signals may be provided to the semiconductor device, for example, by a controller (e.g., controller 10 of FIG. 1). In some embodiments of the disclosure, the memories 110 of FIG. 1 receive commands and/or addresses as shown in the timing diagram of FIG. 9.

FIG. 9 shows system clock signals CK and CKF, select signal CS, command and address signals CA, and a resulting command based on the CA signals CA. The CA signals may be multilevel input signals (e.g., three-level signals, four-level signals, two-level signals, etc.). The CK and CKF clock signals may be complementary. In the example of FIG. 9, the commands resulting from the CA signals are activation commands ACT-1 and ACT-2.

In some embodiments of the disclosure, a command may include two parts: a first command part is received when the CK clock signal transitions from a low clock level to a high clock level (e.g., a rising clock edge R of the CK clock signal) and a second command part is received when the CK clock signal transitions from a high clock level to a low clock level (e.g., a falling clock edge F of the CK clock signal). The first command part may include command operands and addresses, and the second command part may include addresses. The command operand may be decoded to identify a corresponding command (e.g., ACT-1 or ACT-2 commands), and the addresses may include memory addresses, such as bank addresses, row addresses, etc.

Prior to time T0, the select signal CS is active (e.g., active high logic level), and the multilevel CA signals corresponding to the first command part are valid. At time T0, the CK clock signal transitions to a high clock level and a rising edge R0 causes the CA signals to be received, for example, by a command/address input circuit 205, multilevel input buffer 310, input buffer 400, multilevel input buffer 700, or the like. A command operand of the first command part is decoded to identify an ACT-1 command. Prior to a falling clock edge F0 of the CK clock signal, the CA signals corresponding to the second command part are valid. The falling edge F0 of the CK clock signal causes the CA signals to be received. A bank address of the second command part identifies a memory bank to which the ACT-1 command is directed. Other addresses included in the first and second command parts may identify memory cells in the activated bank to be accessed (e.g., row addresses).

Prior to time T1, the select signal CS is active, and the multilevel CA signals corresponding to the first command part are valid. At time T1, the CK clock signal transitions to a high clock level and a rising edge R1 causes the CA signals to be received. A command operand of the first command part is decoded to identify an ACT-2 command. Prior to a falling clock edge F1 of the CK clock signal, the CA signals corresponding to the second command part are valid. The falling edge F1 of the CK clock signal causes the CA signals to be received. A bank address of the second command part identifies a memory bank to which the ACT-2 command is directed. Other addresses included in the first and second command parts may identify memory cells in the activated bank to be accessed. Prior to time T2, the CS signal is inactive (e.g., inactive low logic level), and the CA signals correspond to a deselect command DES. A rising edge R2 of the CK clock signal at time T2 causes the CA signals to be received and decoded to identify a DES command. The DES command causes the activated banks to be deactivated.

As previously described, using multilevel signals, for example, for command/address signals, may allow for using fewer signals to represent a same number of commands and/or addresses, or using a same number of signals to represent a larger number of commands and/or addresses.

FIG. 10 is a diagram of a command structure 1000 for example commands and addresses for multilevel command and address signals according to an embodiment of the disclosure. The command structure 1000 may be used with the system 100 of FIG. 1 in some embodiments of the disclosure. For example, multilevel command and address signals provided by the controller 10 to the memory system 105 may represent commands and addresses having the command structure as shown in FIG. 10. The command structure 1000 may be used with the semiconductor device 200 of FIG. 2 in some embodiments of the disclosure. For example, multilevel command and address signals received by the semiconductor device 200 may represent commands and addresses having the command structure as shown in FIG. 10.

The command structure 1000 shows a select signal CS that is provided to a select terminal, and multilevel command and address signals CA0-CA5 provided to command/address terminals. In some embodiments of the disclosure, three-level CA signals are provided to the command/address terminals. Included in the CA signals is a multipurpose output (MPO), which may be used for additional features. For example, the MPO may be used to provide error correction code (ECC) transparency to a controller (e.g., controller 10 of FIG. 1) in some embodiments of the disclosure. In some embodiments of the disclosure, the MPO may be additionally or alternatively used to provide on-demand feedback to a controller (e.g., uncorrectable error report to the controller for WRITE Link ECC). The MPO may be used for other features in other embodiments of the disclosure. Instead of the MPO, an additional command and address signal CA6 may be provided in some embodiments of the disclosure, for example, to provide expanded set of commands and/or address range.

The example commands and addresses shown by the command structure 1000 include activation commands ACT-1 and ACT-2. Each of the ACT-1 and ACT-2 commands includes a first part and a second part. The first part is received for a rising edge of a clock signal (e.g., a CK clock signal) and the second part is received for a falling edge of the clock signal. The first part of the ACT-1 and ACT-2 commands may include a command operand and addresses. The command operand may identify the command and the addresses may be a portion of a memory address to which the activation commands are directed. The second part may include addresses, for example, addresses of the memory bank(s) to which the activation commands are directed, and other portions of the memory address to which the activation commands are directed. The ACT-1 and ACT-2 commands may be paired such that a full memory address is provided by the portions of the memory address included in the activation commands.

With reference to the command structure 1000, a first part of an ACT-1 command is received at a rising clock edge R of the CK clock signal when the CS signal is active and when the multilevel command signals CA0=1 and CA1=0 (e.g., command operand of 10). The multilevel signals CA2 and CA3 represent three bits R[18:20] of the memory address (e.g., a row address) and the multilevel signals CA4 and CA5 represent another three bits R[21:23] of the memory address. A second part of the ACT-1 command is received at a falling clock edge F of the CK clock signal. The second part of the ACT-1 command includes memory addresses (e.g., memory bank addresses and row addresses). For example, multilevel signals CA0 and CA1 represent three bits BA[0:2] of a bank address and the multilevel signals CA2 and CA3 represent two more bits BA[3:4] of the bank address and a one bit flag. The multilevel signals CA4 and CA5 represent three more bits R[15:17] of the memory address.

Following the second part of the ACT-1 command, a first part of an ACT-2 command is received at a rising clock edge R of the CK clock signal when the CS signal is active and when the multilevel command signals CA0=1 and CA1=1 (e.g., command operand of 11). The multilevel signals CA2 and CA3 represent three bits R[9:11] of the memory address and the multilevel signals CA4 and CA5 represent another three bits R[12:14] of the memory address. A second part of the ACT-2 command is received at a falling clock edge F of the CK clock signal. The second part of the ACT-2 command includes memory addresses (e.g., row addresses). For example, multilevel signals CA0 and CA1 represent three bits R[0:2] of the memory address, the multilevel signals CA2 and CA3 represent three more bits R[3:5] of the memory address, and the multilevel signals CA4 and CA5 represent three more bits R[6:8] of the memory address.

Following the receipt of the ACT-1 and ACT-2 commands, the memory bank corresponding to the memory bank address BA[0:4] is activated and the memory corresponding to the memory address R[0.23] is prepared for a memory operation (e.g., memory access operation).

Figure 11:
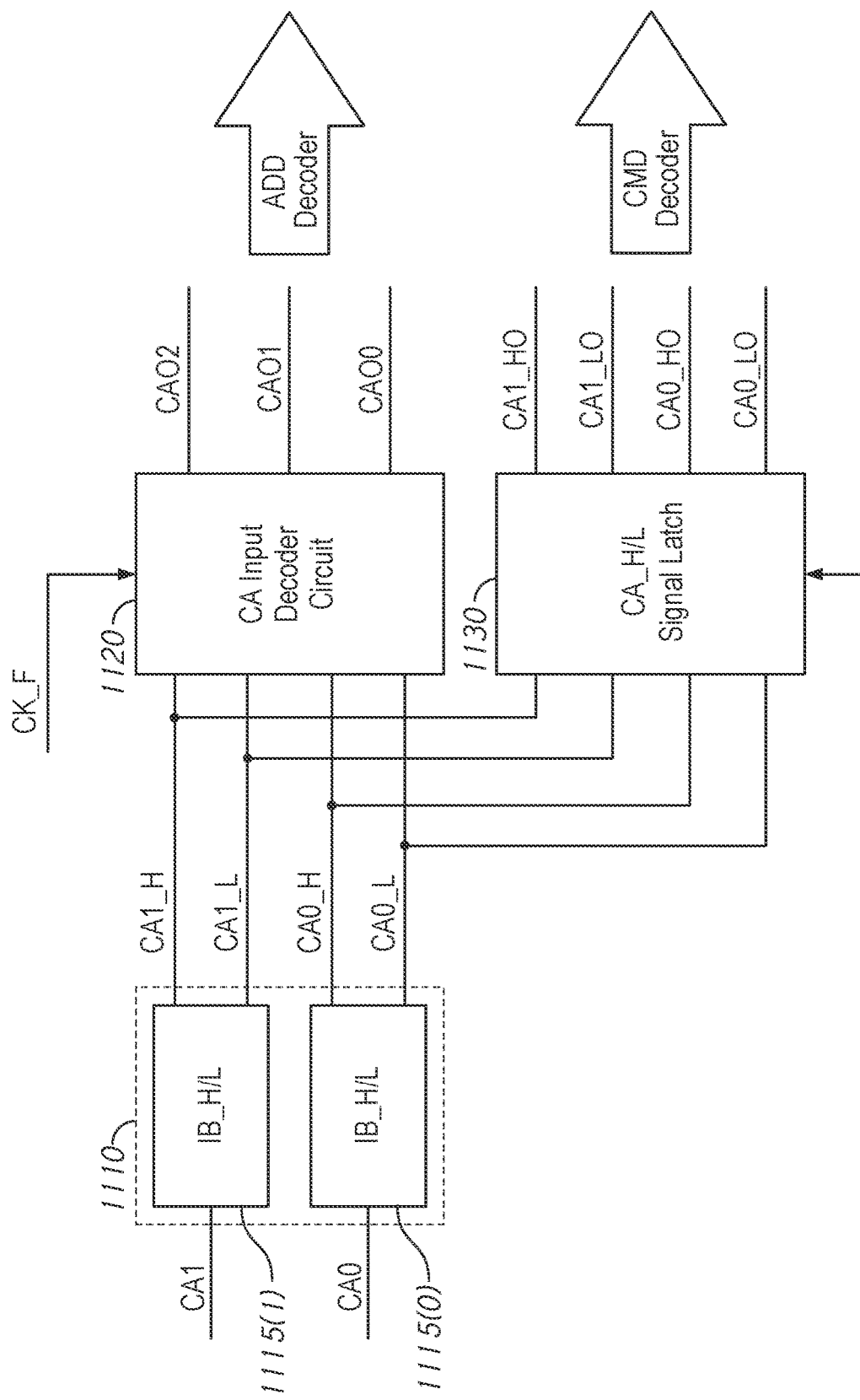
FIG. 11 is a block diagram of a multilevel input buffer, command and address (CA) input decoder circuit, and signal latch according to an embodiment of the disclosure.

FIG. 11 is a block diagram of a multilevel input buffer 1110, command and address (CA) input decoder circuit 1120, and output signal (CA_H/L) latch 1130 according to an embodiment of the disclosure. In some embodiments of the disclosure, the multilevel input buffer 1110, command and address input decoder circuit 1120, and high and low output signal latch 1130 may be included in the command/address input circuit 205 of the semiconductor device 200 of FIG. 2.

In some embodiments of the disclosure, the multilevel input buffer 1110, CA input decoder circuit 1120, and CA_H/L signal latch 1130 may be used with the example commands of FIGS. 10 and 12 to provide internal signals representing non-binary values (e.g., 0, 1, and 2) and binary values (e.g., 0 and 1) from multilevel input signals (e.g., CA0 and CA1). The signals representing non-binary values and/or binary values may be provided to a command decoder and/or address decoder (e.g., command decoder 215 and address decoder 212 of FIG. 2). For example, in some embodiments of the disclosure, output signals (e.g., CAO0_H/L and CAO1_H/L) may be provided by the CA_H/L latch 1130 to the command decoder, and decoded signals (e.g., CAO0-CAO2) may be provided by the CA input decoder circuit 1120 to the address decoder. In some embodiments of the disclosure, the output signals are provided by the CA_H/L latch 1130 for rising edges of a clock signal (e.g., a CK_R clock is active) and the decoded signals are provided by the CA input decoder circuit 1120 for falling edges of a clock signal (e.g., a CK_F clock signal is active).

In embodiments of the disclosure where more than two multilevel signals are used, additional ones of some or all of the multilevel input buffer 1110, CA input decoder circuit 1120, and/or CA_H/L signal latch 1130 may be included. For example, additional multilevel input buffers 1110 may be included for each pair of multilevel CA signals (e.g., CA2-CA5). Additional CA input decoder circuits may be included and/or may be combined together into one CA input decoder circuit 1120 to provide decoded signals. Additional CA_H/L signal latches 1130 be included and/or may be combined together into one CA_H/L signal latch 1130 to provide CA_H/L signals.

In some embodiments of the disclosure, the multilevel input buffer 1110 may include the multilevel input buffer 310 of FIG. 3 or the multilevel input buffer 700 of FIG. 7. In some embodiments of the disclosure, multilevel input buffer circuits 1115(0) and/or 1115(1) may include the multilevel input buffer circuits 315 of FIG. 3, the multilevel input buffer circuit 400 of FIG. 4, or the multilevel input buffer circuit 715 of FIG. 7. In some embodiments of the disclosure, the multilevel input buffer 1110 may provide output signals as described with reference to the relationship between two three-level input signals CA1 and CA0, output signals CA1_H and CA1_L, and CA0_H and CA0L, and decoded signals CAO2-CAO0 of FIG. 8.

In some embodiments of the disclosure, the CA input decoder circuit 1120 may include the command and address input decoder circuit 320 of FIG. 3. In some embodiments of the disclosure, the CA input decoder circuit 1120 may provide decoded signals as described with reference to the relationship between two three-level input signals CA1 and CA0, high and low output signals CA1_H and CA_L, and CA0_H and CA0L, and decoded signals CAO2-CAO0 of FIG. 8.

FIG. 12 is a diagram of a command structure 1200 for example commands and addresses for multilevel command and address signals according to an embodiment of the disclosure. The command structure 1200 may be used with the system 100 of FIG. 1 in some embodiments of the disclosure. For example, multilevel command and address signals provided by the controller 10 to the memory system 105 may represent commands and addresses having the command structure as shown in FIG. 12. The command structure 1200 may be used with the semiconductor device 200 of FIG. 2 in some embodiments of the disclosure. For example, multilevel command and address signals received by the semiconductor device 200 may represent commands and addresses having the command structure as shown in FIG. 12.

The example commands shown in the command structure 1200 include the activation commands ACT-1 and ACT-2 previously described with reference to FIG. 10. FIG. 12 includes additional examples of commands that may be identified by multilevel command and address signals CA. For example, FIG. 12 includes commands precharge PRE, refresh REF, write 16 bits WR16, write 32 bits WR32, mask write MWR, read 16 bits RD16, and read 32 bits RD32. The example commands are not intended to limit the scope of the disclosure to the specific commands shown in FIG. 12, and are provided merely by way of example.

As with the command structure of FIG. 10, the command structure of FIG. 12 shows a select signal CS that is provided to a select terminal, and multilevel command and address signals CA0-CA5 provided to command/address terminals. In some embodiments of the disclosure, three-level command and address signals are provided to the command/ address terminals. Included in the command address signals is a multipurpose output (MPO), which may be used for additional features as previously described. However, instead of the MPO, an additional command and address signal CA6 may be provided in some embodiments of the disclosure, for example, to provide an expanded set of commands and/or address range.

Many of the example commands of FIG. 12 have a structure similar to that of the activation commands ACT-1 and ACT-2 previously described. For example, many of the commands include a first part and a second part. The first part is received for a rising edge R of a clock signal (e.g., a CK clock signal) and the second part is received for a falling edge F of the clock signal. The first part of the commands may include a command operand and addresses, and the second part may include addresses. The command operand may identify the command, and the addresses may be the memory address to which the command is directed, for example, the memory bank(s) and columns of memory to which the command is directed. For these example commands, such as WR16, WR32, MWR, RD16, and RD32, the two parts define the command and provide the memory address of memory bank address BA[0:4] and column address C[0:5].

Other ones of the example commands of FIG. 12 may include a modified structure. For example, with reference to the example commands PRE and REF, a first part includes a command operand for multilevel signals CA0-CA3 and feature settings for multilevel signals CA4 and CA5, and the second part includes memory addresses for multilevel signals CA0-CA3 (e.g., memory bank address RA[0:4]) to which the command is directed and feature settings for multilevel signals CA4 and CA5.

With reference to the example commands of FIGS. 10 and 12, the multilevel CA0-CA5 signals are used to provide command operands to identify a command and to provide memory addresses (e.g., memory bank addresses, row addresses, and although not shown, column addresses). In some embodiments of the disclosure, the command operands may be represented by non-binary values (e.g., 0, 1, 2, etc.) and the memory addresses may be represented by binary values (e.g., bits 0 and 1). In some embodiments of the disclosure, the command operands and memory addresses may be represented by binary values. In some embodiments of the disclosure, the command operands and memory addresses may be represented by non-binary values.

In some embodiments of the disclosure, some or all the multilevel CA signals may represent non-binary values. In some embodiments of the disclosure, some or all of the multilevel CA signals may represent binary values. In some embodiments of the disclosure, the multilevel CA signals may represent a combination of non-binary values and binary values.

In some embodiments of the disclosure, a multilevel input buffer and multilevel input buffer circuits (e.g., multilevel input buffer 310 and multilevel input buffer circuits 315 of FIG. 3, multilevel input buffer circuits 400 of FIG. 4, multilevel input buffer 700 and multilevel input buffer circuits 715 of FIG. 7) may provide output signals (e.g., high output signal CA_H and low output signal CA_L) that represent the non-binary value of a multilevel signal (e.g., relationship between a three-level input signal and logic values represented by the three-level input signal of FIG. 5). In some embodiments of the disclosure, a command and address input decoder circuit (e.g., command and address input decoder circuit 320) may provide decoded signals (e.g., CAOn) representing binary values, for example, based on output signals from a multilevel input buffer (e.g., relationship between two three-level input signals, output signals, and decoded signals of FIG. 8).

The details of the example commands shown in FIGS. 10 and 12 may be modified without departing from the scope of the disclosure. For example, the number of bits representing the memory addresses may be modified, commands may have greater or fewer number of parts, the information included in the parts may be different, the number of multilevel signals used for the commands may be greater or fewer, additional and/or alternative commands may be included, different command operands, etc., and remain within the scope of disclosure.

Certain details are described to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
an address decoder configured to receive address signals and provide decoded addresses;
a command decoder configured to receive internal command signals and provide internal control signals for performing memory operations; and
a command/address input circuit configured to receive a plurality of multilevel command and address signals and provide output signals to the address decoder and the command decoder, wherein the output signals including signals representing binary values and signals representing non-binary values, wherein the signals representing binary values correspond to internal address signals and the signals representing non-binary values correspond to internal command signals.

2. The apparatus of claim 1 wherein the command/address input circuit comprises a multilevel input buffer configured to receive the plurality of multilevel command and address signals and provide a respective pair of output signals for each of the plurality of multilevel command and address signals, the pair of output signals having respective logic levels based on a value represented by the respective multilevel command and address signal.

3. The apparatus of claim 2 wherein the command/address input circuit further comprises a command and address input decoder circuit configured to provide decoded signals based on a plurality of pairs of output signals from the multilevel input buffer, wherein the decoded signals represent bits.

4. The apparatus of claim 3, wherein command and address input decoder circuit is configured to provide the bits to the address decoder.

5. The apparatus of claim 2 wherein the command/address input circuit further comprises a signal latch configured to receive a plurality of pairs of output signals from the multilevel input buffer.

6. The apparatus of claim 5, wherein the signal latch is configured to provide the latched plurality of pairs of output signals to the command decoder.

7. The apparatus of claim 2, wherein the multilevel input buffer comprises a plurality of multilevel input buffer circuits.

8. A method comprising:
receiving, at an address decoder, address signals and provide decoded addresses;
receiving, at a command decoder, internal command signals;
providing, with the command decoder, internal control signals for performing memory operations; and
receiving, at a command/address input circuit a plurality of multilevel command and address signals;
providing, with the command/address input circuit, output signals to the address decoder and the command decoder, wherein the output signals including signals representing binary values and signals representing non-binary values, wherein the signals representing binary values correspond to internal address signals and the signals representing non-binary values correspond to internal command signals.

9. The method of claim 8 further comprising:
receiving, at a multilevel input buffer of the command/address input circuit, the plurality of multilevel command and address signals; and
providing, with the multilevel input buffer, a respective pair of output signals for each of the plurality of multilevel command and address signals.

10. The method of claim 9 wherein the respective pair of output signals have respective logic levels based on a value represented by the respective multilevel command and address signal.

11. The method of claim 9 further comprising providing, with a command and address input decoder circuit of the command/address input circuit, decoded signals based on a plurality of pairs of output signals from the multilevel input buffer, wherein the decoded signals represent bits.

12. The method of claim 11, wherein the bits are provided to the address decoder.

13. The method of claim 9 further comprising receiving, at a signal latch of the command/address input circuit a plurality of pairs of output signals from the multilevel input buffer.

14. The method of claim 13, further comprising providing, with the signal latch, the latched plurality of pairs of output signals to the command decoder.

15. An apparatus comprising:
a command/address input circuit configured to receive a plurality of multilevel command and address signals and provide output signals to an address decoder and a command decoder, wherein the output signals including signals representing binary values and signals representing non-binary values, wherein the signals representing binary values correspond to internal address signals and the signals representing non-binary values correspond to internal command signals.

16. The apparatus of claim 15 wherein the command/address input circuit comprises a multilevel input buffer configured to receive the plurality of multilevel command and address signals and provide a respective pair of output signals for each of the plurality of multilevel command and address signals, the pair of output signals having respective logic levels based on a value represented by the respective multilevel command and address signal.

17. The apparatus of claim 16 wherein the command/address input circuit further comprises:
a command and address input decoder circuit configured to provide decoded signals based on a plurality of pairs of output signals from the multilevel input buffer, wherein the decoded signals represent bits and provide the bits to the address decoder; and
a signal latch configured to receive a plurality of pairs of output signals from the multilevel input buffer and provide the latched plurality of pairs of output signals to the command decoder.

18. The apparatus of claim 16, wherein the multilevel input buffer comprises plurality of multilevel input buffer circuits, each configured to receive a corresponding one of the plurality of multilevel command and address signals.

* * * * *